United States Patent
Endo et al.

(10) Patent No.: US 8,748,734 B2
(45) Date of Patent: Jun. 10, 2014

(54) RECTANGULAR CONDUCTOR FOR SOLAR BATTERY, METHOD FOR FABRICATING SAME AND LEAD WIRE FOR SOLAR BATTERY

(75) Inventors: Yuju Endo, Hitachi (JP); Takashi Nemoto, Hitachi (JP); Hiromitsu Kuroda, Hitachi (JP); Atsushi Ootake, Hitachi (JP); Syuji Kawasaki, Hitachi (JP); Hiroshi Bando, Hitachi (JP)

(73) Assignee: Hitachi Metals, Ltd., Tokyo (JP)

(*) Notice: Subject to any disclaimer, the term of this patent is extended or adjusted under 35 U.S.C. 154(b) by 405 days.

(21) Appl. No.: 11/201,288

(22) Filed: Aug. 11, 2005

(65) Prior Publication Data

US 2007/0017570 A1    Jan. 25, 2007

(30) Foreign Application Priority Data

Aug. 13, 2004 (JP) ................. 2004-235823

(51) Int. Cl.
*H01L 31/0224* (2006.01)

(52) U.S. Cl.
USPC ............ 136/256; 136/252; 439/886

(58) Field of Classification Search
USPC ................ 136/256, 252; 439/886
See application file for complete search history.

(56) References Cited

U.S. PATENT DOCUMENTS

| | | | |
|---|---|---|---|
| 3,630,057 A * | 12/1971 | Strohmeier | ............. 72/47 |
| 6,627,009 B1 | 9/2003 | Matsui et al. | |
| 2002/0112344 A1 * | 8/2002 | Harada et al. | ................ 29/605 |
| 2003/0024733 A1 * | 2/2003 | Aoyama et al. | ............ 174/260 |
| 2006/0162770 A1 | 7/2006 | Matsui et al. | |
| 2008/0169020 A1 | 7/2008 | Shiomi et al. | |

FOREIGN PATENT DOCUMENTS

| | | |
|---|---|---|
| CN | 1957479 A | 5/2007 |
| EP | 1 758 175 A1 | 2/2007 |
| JE | 2003-174179 A | 6/2003 |
| JP | 4-293757 A | 10/1992 |
| JP | 4-313440 A | 11/1992 |
| JP | 7-302923 A | 11/1995 |
| JP | 9-064258 A | 3/1997 |
| JP | 11-021660 A | 1/1999 |
| JP | 2001-148206 A | 5/2001 |
| JP | 2001-352014 A | 12/2001 |
| JP | 2002-109974 A | 4/2002 |

(Continued)

OTHER PUBLICATIONS

Konishi et al., JP 11-021660 online machine translaiton, Jan. 26, 1999.*

(Continued)

*Primary Examiner* — Golam Mowla
(74) *Attorney, Agent, or Firm* — Foley & Lardner LLP

(57) ABSTRACT

A rectangular conductor for a solar battery and a lead wire for a solar battery, in which warping or damaging of a silicon crystal wafer is hard to occur at the time of bonding a connection lead wire even when a silicon crystal wafer is configured to have a thin sheet structure, can be provided. A conductor 1 having a volume resistivity equal to or less than 50 μΩ·mm, and a 0.2% yield strength value equal to or less than 90 MPa in a tensile test is formed into a rectangular conductor 10 for a solar battery having a rectangular cross section, and a surface of the rectangular conductor 10 for a solar battery is coated with a solder plating film 13, to provide a lead wire 20 for a solar battery.

11 Claims, 3 Drawing Sheets

(56) References Cited

FOREIGN PATENT DOCUMENTS

| | | |
|---|---|---|
| JP | 2002-164560 A | 6/2002 |
| JP | 2002-263880 A | 9/2002 |
| JP | 2002-353475 A | 12/2002 |
| JP | 2003-209197 A | 7/2003 |
| JP | 2004-164950 A | 6/2004 |
| JP | 2004-204257 A | 7/2004 |
| WO | WO 2005/114751 A1 | 12/2005 |

OTHER PUBLICATIONS

"JIS Mechanical Engineering Handbook," the 14$^{th}$ Edition, Machine Association, Co., Ltd. Apr. 1, 1974, pp. 4-1 to 4-2, 7-6 to 7-7.

"JIS Z 2241 Method of Tensile Test for Metallic Materials," Japanese Industrial Standards Committee Discussion, revised on Dec. 20, 1998, Japanese Standards Association, Feb. 28, 1999, pp. 1 and 5-6.

"JIS G 0202 Glossary of Terms Used in Iron and Steel (testing)," established on Mar. 1, 1987, Japanese Standards Association, Apr. 30, 1987, pp. 5-6.

http://de.wikipedia.org/wiki/kaltumformung (http://en.wikipedia.org/wiki/Cold_work), German and English.

S. Teshigawara et al., Establishment of Manufacturing Technology for Oxygen-Free Copper for Electronic Devices Using Shaft Furnace, Furukawa Review, No. 113, Jan. 2004, pp. 49-53.

Drawn Copper Product Data Book, Japan Copper and Bass Association, Aug. 1, 1997, pp. 88-89.

Dou oyubi Dou-goukin no Kiso to Kyogo Gijutsu (Basics and Industrial Technologies of Cooper and Copper Alloys) (Revised Version), Oct. 31, 1994, pp. 256, 257, 264, 265.

ASM International, Properties and Selection: Nonferrous Alloys and Special-Purpose Materials, Metals Handbook, 1990, 6 pages, Tenth Edition, vol. 2.

Yuju Endo et al., "Technique for Blanking Fine-Pattern Leadframes in High Performance LSIs.", *Hitachi Cable Review*, No. 15, (Aug. 1996), pp. 63-68.

Yuju Endo et al., "Development of Solder-Coated, Soft-Annealed Copper Flat Wire for Photovoltaic Systems", *Hitachi Cable Review*, No. 26, (Aug. 2007), pp. 1-4.

Yuju Endo et al., "Development of Solder-Coated, Soft-Annealed Copper Flat Wire with High Reliability for Photovoltaic Systems", *Research and Development Laboratory Hitachi Cable, Ltd.*, (Oct. 20, 2010), pp. 24-26.

Partial Translation of Publication 2, "Drawn Copper Product Data Book", *Japan Copper and Brass Association*, (1997), 6 pages.

Metal Reference Book, Fifth Edition, 1976, pp. 1103 and 1112.

An Official Letter dated Aug. 16, 2010 and translation, 16 pages.

Wikipedia (online), Ultimate Tensile Strength, 2013, pp. 1-7.

Wikipedia (online), Kaltumformung, Jan. 31, 2007, 3 pages.

Seigi Aoyama et al., Stiffness of Annealed Copper Wires, Japan Inst. Metals, 1988, pp. 477-484, vol. 52, No. 5.

Drawn Copper Products Data Book, Japan Copper and Brass, Aug. 1, 1997, pp. 16 and 67.

Information Offer Form on Prior Arts, Japanese Application No. 2004-235823, filed Dec. 16, 2003, 14 pages.

Information Offer Form on Prior Arts, Japanese Application No. 2004-235823, filed Dec. 24, 2003, 13 pages.

\* cited by examiner

BEFORE SOLDER BONDING

AFTER SOLDER BONDING

- 75 SOLDER PLATING FILM
- 71 COPPER MATERIAL
- 73 INVAR
- 71 COPPER MATERIAL

- 63 SOLDER PLATING FILM
- 61 RECTANGULAR CONDUCTOR

RECTANGULAR CONDUCTOR FOR SOLAR BATTERY, METHOD FOR FABRICATING SAME AND LEAD WIRE FOR SOLAR BATTERY

The present application is based on Japanese Patent Application No. 2004-235823 filed on Aug. 13, 2005, the entire contents of which are incorporated herein by reference.

BACKGROUND OF THE INVENTION

1. Field of the Invention

The present invention relates to a rectangular conductor for a solar battery, method for fabricating the same and a lead wire for a solar battery using the rectangular conductor, in more particular, to a rectangular conductor for a solar battery, method for fabricating the same and a lead wire for a solar battery using the rectangular conductor, which realizes an excellent electrical characteristics and a less warping of a Si cell of the solar battery when the rectangular conductor is bonded to the Si cell by solder bonding.

2. Description of the Related Art

As shown in FIG. 1, in a solar battery 50 comprising a silicon crystal layer grown on a substrate, a connection lead wire 53 is usually bonded to a predetermined region of a silicon crystal wafer (Si cell) 51, and an electric current flows through the connection lead wire 53.

The connection lead wire 53 comprises a rectangular conductor and a solder plating film formed on a surface of the rectangular conductor, and the solder plating film is used for bonding with the Si cell 51. For example, Japanese Patent Application Laid-Open (Kokai) No. 11-21660 proposes, that a pure copper such as tough pitch copper or oxygen-free copper is used as a rectangular conductor, and a Sn—Pb eutectic crystal solder is used as the solder plating film formed at an outer surface of the rectangular conductor. Further, as disclosed in Japanese Patent Application Laid-Open (Kokai) No. 2002-263880, it is examined in recent years to change a material of a solder plating film into a solder that does not contain Pb (Pb-free solder), because of environmental concerns.

So as to reduce a manufacture cost, a decrease in thickness of a silicon crystal wafer is examined, since a cost of the silicon crystal wafer constitutes the majority of material cost among materials composing a solar battery. However, as shown in FIG. 2, when a silicon crystal wafer is made to be a thin sheet, the Si cell 51 and the connection lead wire 53 bonded with each other by a solder plating 55 might be warped or damaged, due to the temperature variation in heating process during the solder bonding of the connection lead wire 53 or in usage of the solar battery. Accordingly, so as to solve the above problems, needs of a wire rod having a low thermal expansion for the connection lead wire 53 arises.

Japanese Patent Laid-Open (Kokai) No. 2004-204257 proposes a lead wire 70 for a solar battery which has a low thermal expansion, in which an invar (Fe-36 mass % Ni) sheet 73 having a low thermal expansion is clad in a copper material 71, and a solder plating film 75 is formed on a surface of a conductor made of Cu-clad invar as shown in FIG. 3.

TABLE 1 shows material properties of copper-invar-copper (Cu/Fe-36 mass % Ni/Cu) in comparison with material properties of Cu, invar (Fe-36 mass % Ni), and silicon, respectively.

TABLE 1

| Material | Clad material (Cu/Fe-36mass % Ni/Cu) Ratio of sheet thickness is 2:1:2 | Cu | Fe-36mass % Ni | Si |
|---|---|---|---|---|
| Thermal expansion coefficient ($\times 10^{-5}/^\circ$ C.) | 13.1 | 17.0 | 1.8 | 3.5 |
| Young's modulus (MPa) | 125 | 120 | 145 | 170 |
| Volume resistivity ($\mu\Omega \cdot$ mm) | 21.0 | 16.9 | 810 | $2.3 \times 10^9$ |

As understood from TABLE 1, when a rectangular conductor of Cu-clad invar (copper-invar-copper) by using the invar having a low thermal expansion is manufactured, although a thermal expansion matching with Si can be realized, a volume resistivity increases compared with Cu, so that a power generating efficiency as a solar battery falls due to a decrease of an electric conductivity. Further, since the invar contains about 36% by mass of the nickel, such a rectangular conductor becomes expensive.

In addition, in a three-layer structure lead frame using the copper-invar-copper as a conductor, deformation such as warping may be caused by heterogeneity of orientation or crystal grain of a crystal of copper material disposed on both sides of the invar. These factors cause the deterioration in productivity of solar battery modules or the deterioration in reliability of the generating efficiency after a long-term use. In addition, joint portions of the copper-invar-copper at side surfaces of the lead frame may be exposed to moisture, so that the exposed portion might become like a local battery and finally might be corroded.

Furthermore, in the lead frame using the invar, there is a disadvantage in that a large quantity of wasted materials is produced, since a stamping process is conducted at the time of forming a circuit, thereby increasing a manufacturing cost.

SUMMARY OF THE INVENTION

Accordingly, it is an object of the present invention to provide a rectangular conductor for a solar battery and a lead wire for a solar battery, in which warping or damaging of a silicon crystal wafer is hard to occur at the time of bonding a connection lead wire to the silicon crystal wafer, even if the silicon crystal wafer is configured to have a thin sheet structure.

Further, it is another object of the present invention to provide a rectangular conductor for a solar battery and a lead wire for a solar battery, which has an excellent electric conductivity.

Furthermore, it is a further object of the present invention to provide a method for fabricating a rectangular conductor for a solar battery, by which the increase of manufacturing cost can be suppressed.

According to a first feature of the present invention, a rectangular conductor for a solar battery, comprises:

a conductor having a volume resistivity equal to or less than 50 $\mu\Omega \cdot$mm, and a 0.2% yield strength value equal to or less than 90 MPa in a tensile test.

Preferably, the conductor may be composed of an element selected from one of a group consisting of Cu, Al, Ag and Au.

According to a second feature of the present invention, a method for fabricating a rectangular conductor for a solar battery, comprises the steps of:

rolling a conductor having a volume resistivity equal to or less than 50 μΩ·mm to have a rectangular cross section; and conducting a heat treatment for the rectangular conductor to have a 0.2% yield strength value equal to or less than 90 MPa in a tensile test.

The step of conducting the heat treatment may be conducted by flowing a current through the conductor. The step of conducting the heat treatment may be conducted by heating the conductor using the heater.

According to a third feature of the present invention, a lead wire for a solar battery, comprises:

a rectangular conductor having a volume resistivity equal to or less than 50 μΩ·mm, and a 0.2% yield strength value equal to or less than 90 MPa in a tensile test; and a solder plating film provided on at least a region of a surface of the rectangular conductor.

Preferably, the solder plating film may be composed of Sn—Ag—Cu based Pb free solder.

According to the present invention, since 0.2% yield strength value of a conductor is reduced, it is possible to reduce a warping force for a Si cell, which is generated by a thermal contraction of the conductor after solder bonding. Therefore, when the thermal contraction after the solder bonding to the Si cell is conducted, the warping of Si cell can be decreased.

Further, since a conductor having a volume resistivity equal to or less than 50 μΩ·mm is used, a connection lead wire for a solar battery having a high electric conductivity can be provided.

Furthermore, according to a method for fabricating a conductor for a solar battery of the present invention, since 0.2% yield strength value of a conductor is reduced by heat treatment, it is possible to provide a rectangular conductor for a solar battery by using a simple method with a reduced manufacturing cost.

BRIEF DESCRIPTION OF THE DRAWINGS

The present invention will be explained in more detail in conjunction with appended drawings, wherein.

DESCRIPTION OF THE PREFERRED EMBODIMENT

Preferred embodiments according to the present invention will be explained in detail hereinafter by referring to the appended drawings.

1. Rectangular Conductor for a Solar Battery

Figure 1:
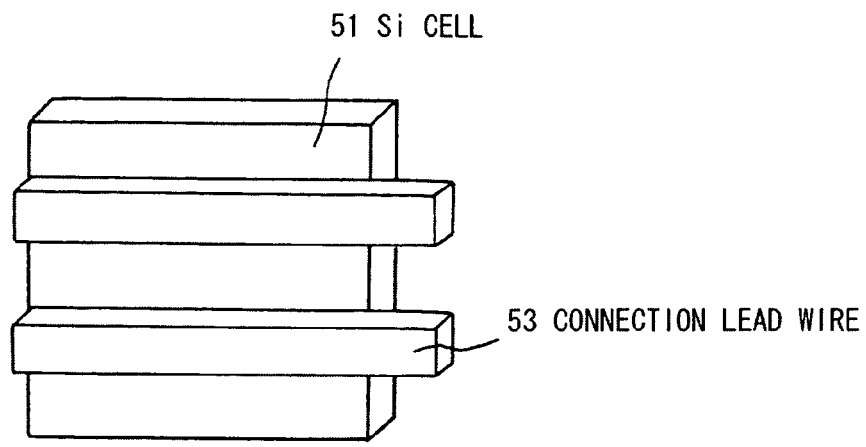
FIG. 1 is a perspective view showing a bonding condition of a connection lead wire for a solar battery.
Figure 2:
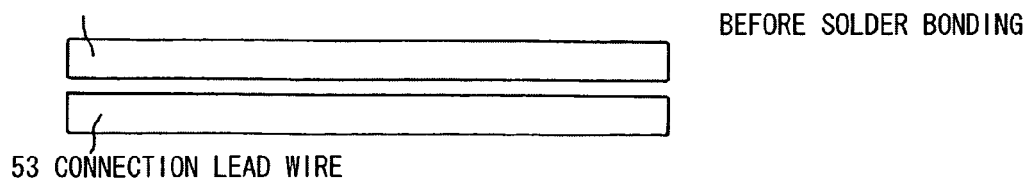
FIG. 2 is an explanatory diagram showing a warping occurred when a connection lead wire is connected to a Si cell by solder bonding.
Figure 2:
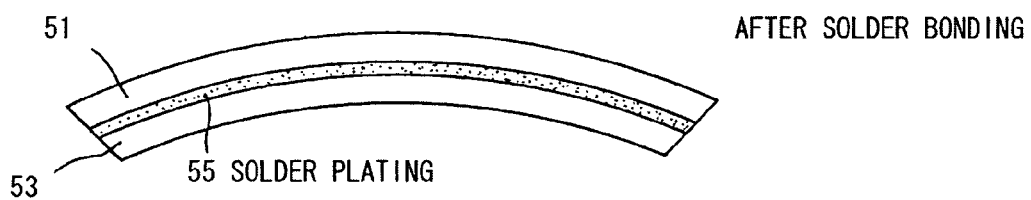
Figure 3:
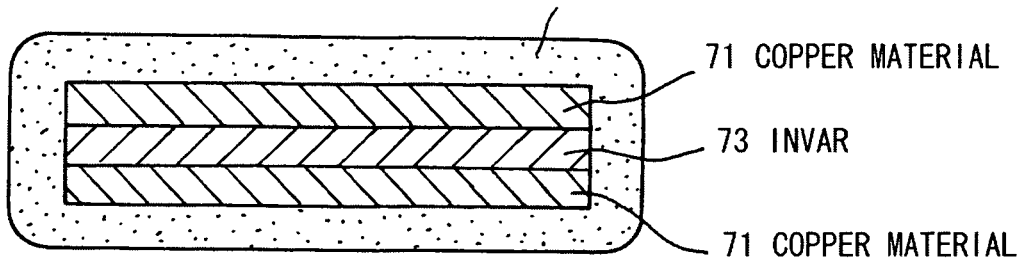
FIG. 3 is a cross sectional view showing a conventional connection lead wire for a solar battery.
Figure 4:
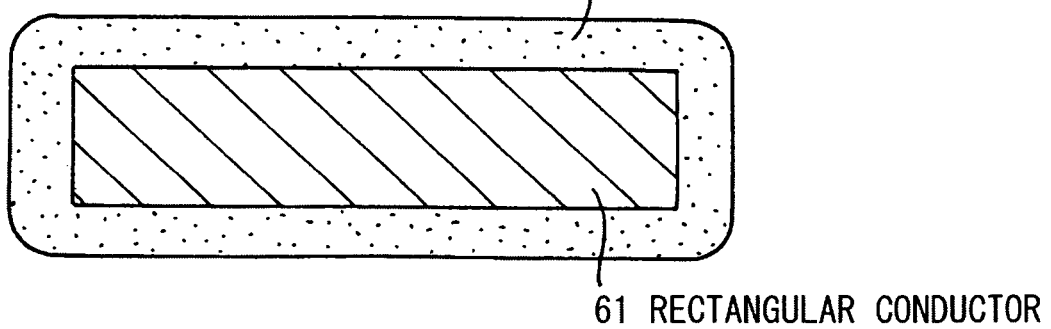
FIG. 4 is a cross sectional view showing an example of a lead wire for a solar battery.

FIG. 4 shows a cross sectional view of an example of a lead wire 60 for a solar battery in which a solder plating film 63 is formed around a surface of a rectangular conductor 61. In general, the rectangular conductor 61 is normally composed of Cu such as tough pitch, oxygen free Cu, etc.

Figure 5:
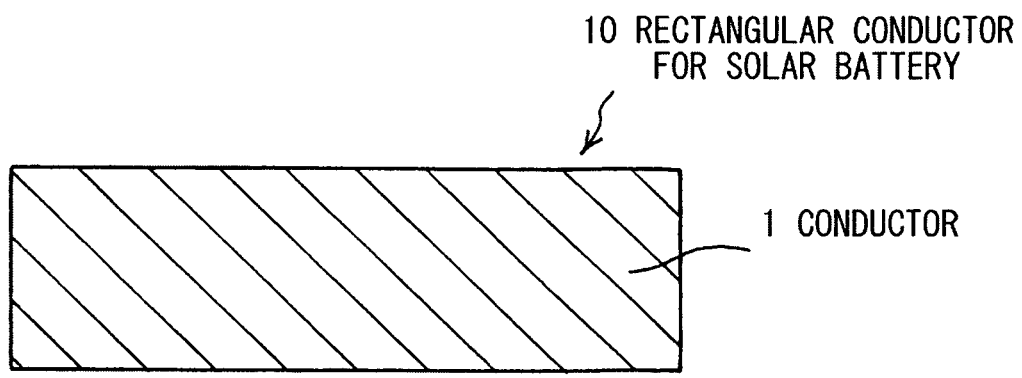
FIG. 5 is a cross sectional view showing a rectangular conductor for a solar battery in a preferred embodiment according to the present invention.

FIG. 5 shows a rectangular conductor for a solar battery in a preferred embodiment according to the present invention. A rectangular conductor 10 for a solar battery comprises a conductor 1 of a soft material and having a rectangular cross section as an outer configuration, such that the solder bonding to a Si cell can be facilitated.

2. Volume Resistivity of a Conductor

It is preferable that a conductor material having a relatively low volume resistivity (for example, volume resistivity equal to or less than 50 μΩ·mm) as the conductor 1, so as to reduce a generation loss of electrical energy in the solar battery.

As a conductor material having a relatively low volume resistivity, there are Au, Ag, and Al other than Cu as shown in TABLE 2. Ag has the lowest volume resistivity among these elements, and the power generating efficiency can be made maximum by using Ag. On the other hand, when the decrease of manufacturing cost is given priority to the other objects, it is preferable to use Cu, and when the reduction of weight is intended, it is preferable to choose Al.

TABLE 2

| Material | Cu | Ag | Au | Al |
|---|---|---|---|---|
| Thermal expansion coefficient (×10⁻⁵/° C.) | 17.0 | 19.1 | 29.0 | 23.5 |
| 0.2% yield strength (MPa) | 40 | 55 | 30 | 20 |
| Volume resistivity (μΩ · mm) | 16.9 | 16.3 | 22.0 | 26.7 |

3. 0.2% Yield Strength Value of Conductor

In general, when different kinds of metals having different thermal expansion coefficients are connected with each other at a high temperature, an integrated value of a temperature variation, a thermal expansion coefficient, and a Young's modulus corresponds to a warping generating force. However, in a solar battery, the rigidity of materials of the members to be connected with each other is considerably different. Further, when a temperature for solder bonding is more than 200° C., a conductor having a smaller cross section will yield, so that the integrated value of the temperature variation, thermal expansion coefficient and Young's modulus does not directly correspond to the warping generating force.

In case of a conductor, when a yield stress is low, a plastic deformation may be caused by a little force, and a further deformation resistance does not occur. In other words, lower the strength and yield strength are, less the load is applied to a silicon crystal wafer at the time of bonding. Therefore, the 0.2% yield strength value is used as a barometer of the plastic deformation in a tensile test. The 0.2% yield strength value of conductor 1 may be equal to or lower than 90 MPa, preferably equal to or lower than 80 MPa, and more preferably equal to or lower than 70 MPa. By choosing a soft material conductor with a low 0.2% yield strength value, a thermal stress at the time of bonding a conductor to the silicon crystal wafer can be reduced. In addition, by determining the 0.2% yield strength value of the conductor 1 equal to or lower than 80 MPa, the warping of the Si cell can be made smaller compared with the

case where the conductor composed of Cu-clad invar material (copper-invar-copper) is used, thereby providing a greater effect in practical use.

4. Method of Fabricating a Rectangular Conductor for a Solar Battery

The rectangular conductor 10 for a solar battery is fabricated as follows. A conductor 1 is formed to have a rectangular cross section by the die wire drawing or rolling, or by a composite process of the die wire drawing and rolling, then the conductor 1 is heat-treated by a current flowing type equipment or batch type equipment, thereby reducing the 0.2% yield strength. Herein, the batch type heat treatment by using a heater is more preferable than the current flowing type heat treatment, since the batch type heat treatment can provide a sufficient thermal energy in comparison with the current flowing type heat treatment, as a thermal process for reducing the 0.2% yield strength. Otherwise, a furnace with a hydrogen reduction atmosphere can be used so as to prevent oxidation of the conductor 1.

5. Lead Wire for a Solar Battery

Figure 6:
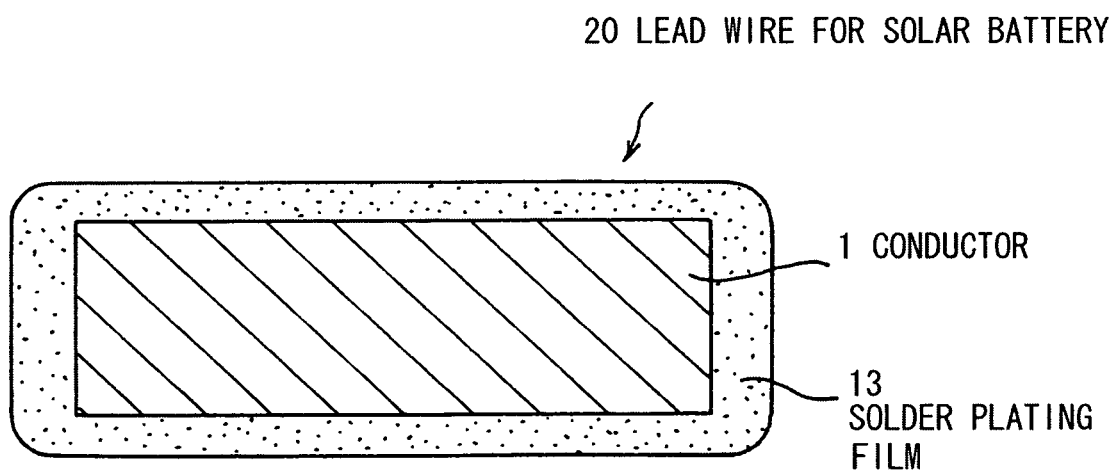
FIG. 6 is a cross sectional view showing a lead wire for a solar battery in the preferred embodiment according to the present invention.

FIG. 6 shows a lead wire for solar battery in the preferred embodiment according to the present invention.

A lead wire 20 for a solar battery is formed by providing a solder plating film 13 on an entire surface of the conductor 1 shown in FIG. 5. In consideration of the environmental concerns, the solder plating film 13 is composed of a Pb free solder. The solder plating film 13 is provided at an outer surface of the conductor 1.

A solder composition enabling a low-temperature bonding has been required until now in view of the thermal expansion matching with the Si cell. However, by using the conductor 1 in the preferred embodiment according to the present invention, it is possible to use Sn—Ag—Cu based solder with a high bonding temperature.

A solar battery assembly can be provided by bonding this lead wire for a solar battery to a predetermined contact region (for example, Ag plating region) of a cell surface in a silicon crystal wafer (a solar battery module)

6. Effect of the Rectangular Conductor for a Solar Battery and Lead Wire for Solar Battery As discussed above, according to a rectangular conductor for a solar battery and lead wire for a solar battery in this preferred embodiment of the present embodiment, since the 0.2% yield strength value of a conductor is reduced, it is possible to reduce a warping force of a cell, which is generated by a thermal contraction of the conductor after solder bonding. Therefore, even when the thermal contraction after the solder bonding to the Si cell is occurred, the warping of Si cell can be decreased.

Further, according to a rectangular conductor for a solar battery and lead wire for a solar battery in this preferred embodiment of the present embodiment, a conductor having a volume resistivity equal to or less than 50 μΩ·mm and a high electric conductivity is used, so that a power generating efficiency of a solar battery can be kept excellent.

Furthermore, according to a method for fabricating a conductor for a solar battery in this preferred embodiment of the present invention, since the 0.2% yield strength value of the conductor is reduced by heat treatment, it is possible to provide a rectangular conductor for a solar battery by using a simple method with a reduced manufacturing cost.

7. Embodiment

Cu rod having a width of 2.0 mm and thickness of 0.16 mm is rolled into a rectangular strip, so that a conductor 1 shown in FIG. 6 is obtained. Then, an outer surface of the conductor 1 is coated with a solder plating film 13 made of Sn-3% Ag-0.5% Cu based Pb free solder, to provide a lead wire 20 for a solar battery.

As shown in TABLE 3, by varying the heat treatment conditions, samples of lead wires 20 for a solar battery having various 0.2% yield strength values are fabricated, and a warping condition when the lead wire 20 is connected with a Si cell having a size of 150 mm×150 mm and a thickness of 200 μm by solder bonding is examined.

TABLE 3

| 0.2% yield strength (MPa) | 140 (Cu) | 80 (Cu) | 50 (Cu) | 40 (Cu) |
|---|---|---|---|---|
| Warping (mm) | 4.0 | 3.2 | 2.1 | 1.5 |

As understood from TABLE 3, the warping of the cell is reduced in accordance with the decrease of the 0.2% yield strength value of the conductor. The warping of a cell bonded to the lead wire 20 using a Cu conductor with 0.2% yield strength value of 40 MPa can be reduced to about ⅓ of the warping of the cell bonded to the lead wire 20 using a Cu conductor with 0.2% yield strength value of 140 MPa.

As comparative examples, the warping of a cell bonded to the lead wire using a conductor made of Cu-invar-Cu (sheet thickness ratio is 2:1:2) and the warping of a cell bonded to a Cu conductor with 0.2% yield strength value of 40 MPa are examined. As a result, the warping of the former cell is 3.0 mm, while the warping of the latter cell is reduced to a half of the former cell, i.e. 1.5 mm.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching herein set forth.

What is claimed is:

1. A rectangular conductor, comprising:
   a conductor having a volume resistivity equal to or less than 50 μΩ·mm, and a 0.2% yield strength value equal to or less than 80 MPa in a tensile test;
   wherein the conductor comprises Cu,
   wherein the conductor is configured to be bonded by soldering to a contact region of a silicon crystal wafer of a solar battery, and
   wherein a warping force generated by a thermal contraction of the conductor after solder bonding to the silicon crystal wafer is reduced such that a warping is equal to or less than 3.2 mm.

2. A method for fabricating a rectangular conductor, comprising the steps of:
   rolling a conductor having a volume resistivity equal to or less than 50μΩ·mm to have a rectangular cross section; and
   conducting a heat treatment for the rectangular conductor to have a 0.2% yield strength value equal to or less than 80 MPa in a tensile test;

wherein the conductor comprises Cu, wherein the rectangular conductor is configured to be bonded by soldering to a contact region of a silicon crystal wafer of a solar battery, and wherein a warping force generated by a thermal contraction of the rectangular conductor after solder bonding to the silicon crystal wafer is reduced such that a warping is equal to or less than 3.2 mm.

3. The method for fabricating a rectangular conductor, according to claim 2, wherein:

the step of conducting the heat treatment is conducted by flowing a current through the conductor.

4. The method for fabricating a rectangular conductor, according to claim 2, wherein:

the step of conducting the heat treatment is conducted by heating the conductor using a heater.

5. A lead wire, comprising:

a rectangular conductor having a volume resistivity equal to or less than 50 $\mu\Omega\cdot$mm, and a 0.2% yield strength value equal to or less than 80 MPa in a tensile test; and a solder plating film provided on at least a region of a surface of the rectangular conductor;

wherein the conductor comprises Cu, wherein the lead wire is configured to be bonded by soldering to a contact region of a silicon crystal wafer of a solar battery, and wherein a warping force generated by a thermal contraction of the lead wire after solder bonding to the silicon crystal wafer is reduced such that a warping is equal to or less than 3.2 mm.

6. The lead wire, according to claim 5, wherein:

the solder plating film is composed of Sn—Ag—Cu based Pb free solder.

7. The rectangular conductor, according to claim 1, wherein the conductor is in a heat treated condition.

8. The lead wire, according to claim 5, wherein the conductor is in a heat treated condition.

9. An arrangement comprising:

a conductor having a volume resistivity equal to or less than 50$\mu\Omega\cdot$mm, and a 0.2% yield strength value equal to or less than 80 MPa in a tensile test;

wherein the conductor comprises Cu, wherein the conductor is bonded to a contact region of a silicon crystal wafer of a solar battery, and wherein a warping force generated by a thermal contraction of the conductor after bonding to the silicon crystal wafer is reduced such that a warping is equal to or less than 3.2 mm.

10. The rectangular conductor, according to claim 1, wherein the volume resistivity is equal to or less than 50$\mu\Omega\cdot$mm, and the 0.2% yield strength value is equal to or less than 50 MPa in the tensile test.

11. The rectangular conductor, according to claim 1, wherein the conductor consists of Cu.

* * * * *